United States Patent
King et al.

(10) Patent No.: US 6,288,545 B1
(45) Date of Patent: *Sep. 11, 2001

(54) METHOD AND APPARATUS FOR CALIBRATION OF RF AND GRADIENT FIELD TIME DELAYS

(75) Inventors: Kevin F. King, New Berlin; Alexander Ganin, Whitefish Bay, both of WI (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/274,468

(22) Filed: Mar. 22, 1999

(51) Int. Cl.$^7$ ........................................... G01V 3/00
(52) U.S. Cl. ................................................ 324/318
(58) Field of Search ................... 324/318, 322, 324/309, 307

(56) References Cited

U.S. PATENT DOCUMENTS

| | | | |
|---|---|---|---|
| 5,545,995 | 8/1996 | Schneider et al. | 324/318 |
| 5,587,657 | 12/1996 | Kanazawa | 324/309 |
| 5,818,229 | * 10/1998 | Kanazawa | 324/309 |
| 6,025,718 | * 2/2000 | Hushek | 324/316 |
| 6,111,411 | * 8/2000 | Saranathan et al. | 324/313 |

FOREIGN PATENT DOCUMENTS 0 230 027 A2  7/1987 (EP) ........................ 87/31

OTHER PUBLICATIONS

Craig H. Meyer, John M. Pauly, Albert Macovski, and Dwight G. Nisimura, *Simultaneous Spatial and Spectral Selective Excitation*, Magnetic Resonance in Medicine 15, 287–304 (1990).

Joachim R. Wesener and Harald Gunther; Journal of Magnetic Resonance; 62, pp. 158–162, 1985.*

* cited by examiner

Primary Examiner—Christine Oda
Assistant Examiner—Dixomara Vargas
(74) Attorney, Agent, or Firm—Fletcher, Yoder & Van Someren

(57) ABSTRACT

A technique is disclosed for calibrating time delays between RF and gradient frequency pulses in a magnetic resonance imaging system. The calibration procedure includes the formation of calibration images of a phantom positioned in the gradient field system. Calibration images are processed and compared to one another to determine deviation between locations in the gradient field system and the impact of radio frequency-to-gradient waveform time delays on the deviations. Optimal time delays are identified which minimize the deviations between the calibration images. Multiple axes of the system may be calibrated through the use of symmetrical phantoms and similar pulse sequences of each axis. A spectral-spatial pulse sequence is employed bearing the calibration routine.

29 Claims, 4 Drawing Sheets

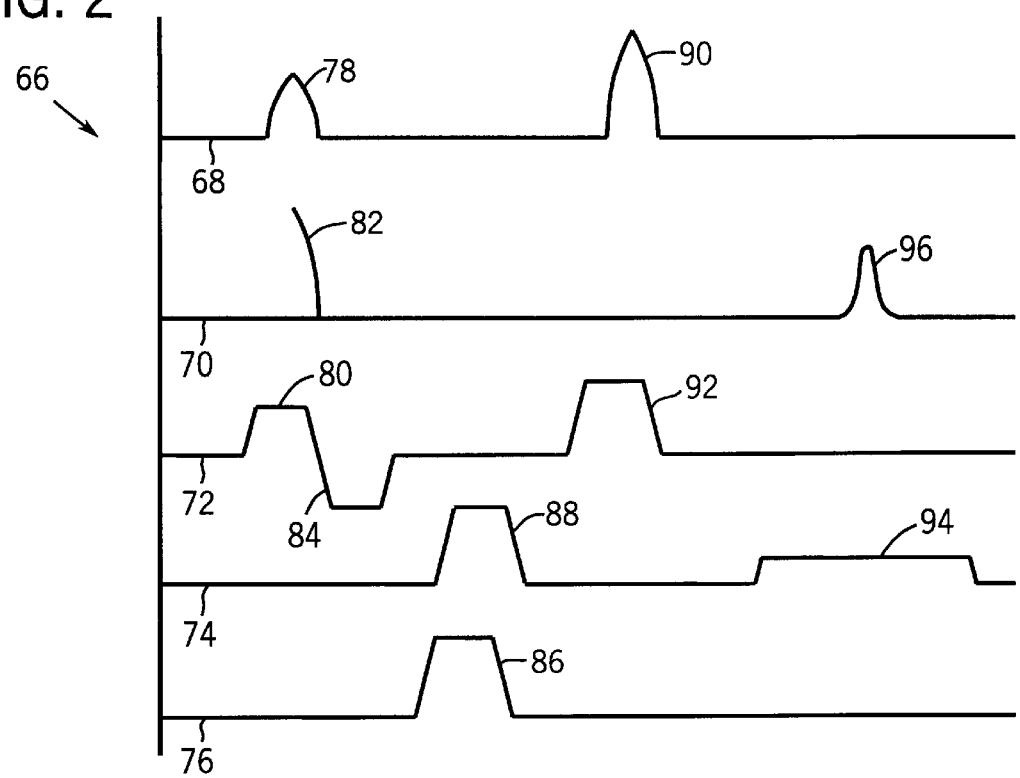
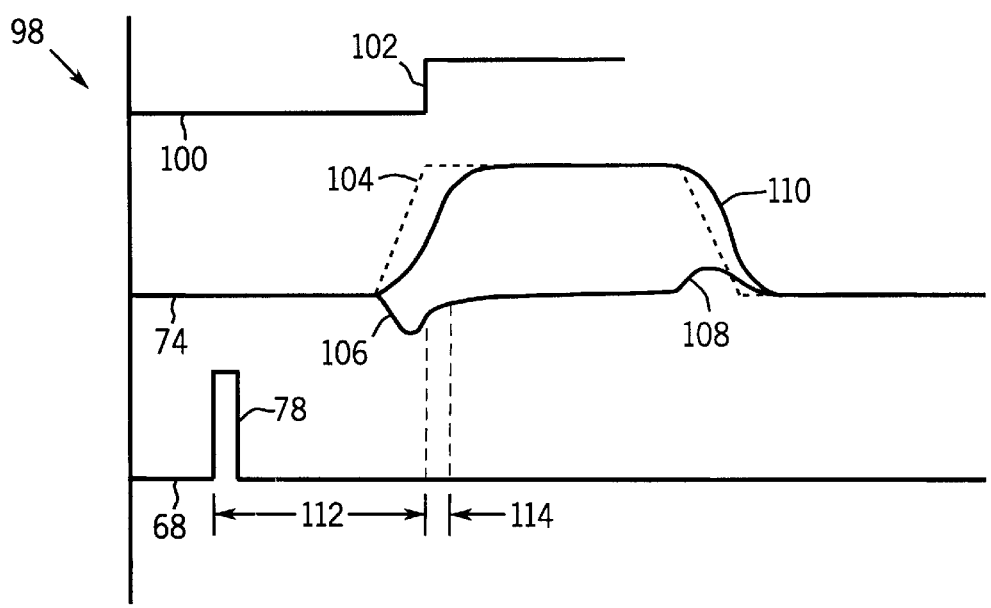

METHOD AND APPARATUS FOR CALIBRATION OF RF AND GRADIENT FIELD TIME DELAYS

FIELD OF THE INVENTION

The present invention relates generally to the field of magnetic resonance imaging systems used in medical diagnostics and other applications. More particularly, the invention relates to a technique for calibrating time delays between radio frequency pulses and other pulses produced in sequences in MRI systems during examination procedures to produce images.

BACKGROUND OF THE INVENTION

Magnetic resonance imaging systems have become ubiquitous in the field of medical diagnostics. Over the last several decades the physics involved in magnetic resonance imaging has become well understood and increasingly sophisticated systems have been developed to produce high-quality useful images for medical purposes. Increasing work in the field concentrates on further improvement of the image quality and obtaining images which are acquired rapidly, with little patient discomfort, and which are even more useful for radiologists and physicians in identifying features within the patient's anatomy.

In general, MRI systems produce images by sensing emissions from gyromagnetic materials in the subject produced in response to radio frequency pulses in the presence of a primary magnetic field. The primary magnetic field is typically aligned with the patient's body and affects the precession of certain molecules in the patient's tissue. The alignment of these molecules with the magnetic field and their precession at characteristic frequencies dependent upon the field strength are the bases for the imaging physics. A series of gradient fields are produced by additional coils in the MRI system. These coils produce fields which vary in strength in predictable and controlled manners to produce field gradients. The field gradients are used to select a slice of interest to be imaged, and to encode the gyromagnetic material response as a function of frequency and phase. By processing the sensed emissions from the gyromagnetic material in response to radio frequency pulses, the influence on the gyromagnetic molecules encoded by the gradients permits the emissions to be analyzed to appropriately locate specific responses at specific positions in the slice. Through reconstruction techniques, then, a useful image can be produced which comprises an array of adjacent picture elements or pixels corresponding to volume elements or voxels within the selected slice. The reconstructed image may be saved in digital form, transmitted, printed, transferred to photographic film, and so forth, depending upon the desired end use.

Despite the advances in MRI systems, there remain difficulties in obtaining the desired image quality. For example, coordination of beginning and ending times of pulses generated during examination sequences is often difficult to control precisely. These pulses include both radio frequency pulses and pulses used to define the desired magnetic field gradients. While ideal pulse profiles and timing between pulses can be defined precisely, in actual implementation variations often occur in both the pulse profile and the pulse timing.

Such variations may have several causes. For example, timing coordination may be affected by the response of electronic circuitry used to drive the radio frequency and gradient coils. The circuitry typically includes analog-to-digital and digital-to-analog converters, digital and analog band limiting filters, amplifiers, and so forth. Another important source of pulse variations is residual or uncompensated eddy currents which may be produced by structures surrounding one or more of the coils of the MRI system. Such eddy currents result from changes in the magnetic fields generated by the coils, and will tend to be more pronounced when high amplitude and rapidly changing fields are generated. Not only are such eddy currents difficult to model, but they may vary between physical axes on a particular MRI system, as well as between axes on various systems, even of the same type of model.

Attempts have been made to compensate for relative timing delays or shifts, as well as for variations in waveforms resulting from such delays. For example, compensations for delays may be implemented through software used to define the pulse sequences of the MRI examinations. However, such solutions are not well suited to situations where the delays vary within and between particular systems. Rather, a single delay is commonly used for all systems, providing an approximation of the effects, but failing to account for system variations. As a result, image quality problems can occur when actual variations or delays differ from system to system or within a single system. For example, with certain RF excitation pulses, errors in relative timing between radio frequency pulses and gradient waveforms can cause intensity variations for important gyromagnetic materials, such as water, in off-center slices. Other image undesirable artifacts can also result from the errors in pulse profile and timing.

There is a need, therefore, for a technique for identifying and calibrating time delays between RF and gradient field pulses in MRI systems. There is a particular need for a technique which permits such time delays to be identified and calibrated in a fairly straightforward manner on a single axis or multiple axes of a single system, permitting customization of pulse sequences for individual systems and even individual axes.

SUMMARY OF THE INVENTION

The present invention provides a calibration technique designed to respond to these needs. The technique makes use of a series of images which are created of a standard measurement article, such as a water-filled phantom. The phantom may be symmetrical with respect to a single axis or may be used to produce calibration images of multiple axes in the system. A calibration pulse sequence is employed which is used to generate the calibration images of the phantom at an isocenter of the gradient field system and at least one offset position. The pulse sequence employed during the calibration may be a spectral-spatial (SPSP) sequence which provides both specific location and specific frequency offsets. The test images are analyzed to determine whether the calibrated delay is within an acceptable band. A reiterative process is employed to adjust the pulse timing to provide the desired level of uniformity between the test images. The optimum delay is identified through the process. Several optimum delays may be identified through similar sequences, such as for each physical axis of an MRI system.

BRIEF DESCRIPTION OF THE DRAWINGS

FIG. 2 is a diagram of a typical pulse sequence used in an examination in the system of FIG. 1;

FIG. 3 is a graphical representation illustrating typical causes of delays and profile variations in pulse sequences, particularly between RF and gradient pulses in an MRI system;

DETAILED DESCRIPTION OF THE INVENTION

Figure 1:
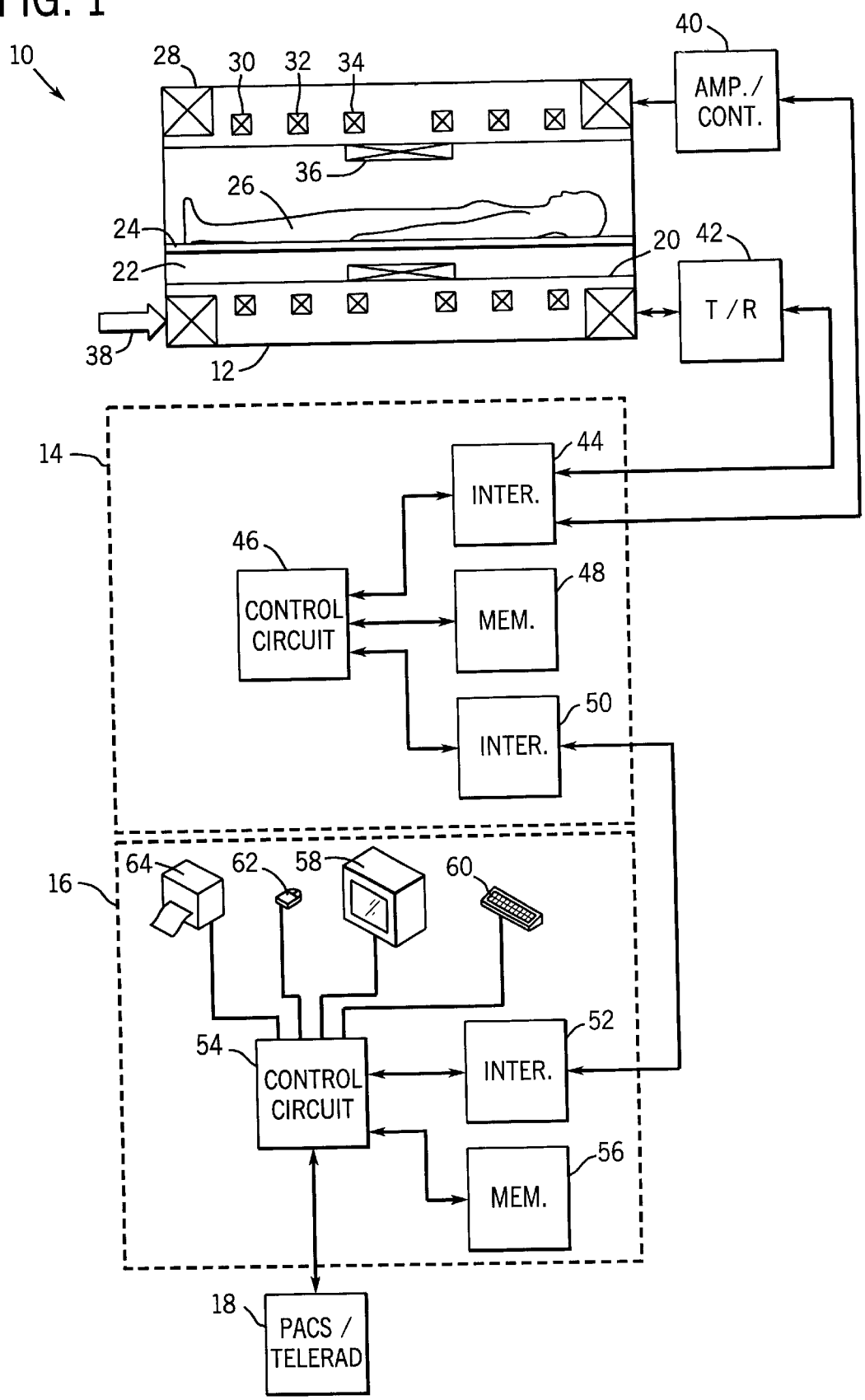
FIG. 1 is a diagrammatical representation of an MRI system adapted for calibration of delays between RF and gradient pulses in accordance with aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. In addition, system 10 may include remote access and storage systems or devices as represented generally at reference numeral 18 which may include picture archiving and communication systems (PACS), teleradiology equipment, and so forth. While MRI system 10 may include any suitable MRI scanner or detector, in the illustrated embodiment, the system includes a full body scanner comprising a housing 20 through which a patient bore 22 is formed. A table 24 is slidable into bore 22 to permit a patient 26 to be positioned thereon for imaging selected anatomy within the patient.

Scanner 12 includes a series of associated coils for producing controlled magnetic fields and for detecting emissions from gyromagnetic material within the patient in response to radio frequency pulses. In the diagrammatical view of FIG. 1, a primary magnet coil 28 is provided for generating a primary magnetic field generally aligned with the patient bore 22. A series of gradient coils 30, 32 and 34 permit controlled magnetic gradient fields to be generated during examination sequences as described more fully below. A radio frequency coil 36 is provided for generating radio frequency pulses for exciting the gyromagnetic material. While a separate receiving coil may be provided, in the illustrated embodiment, RF coil 36 also serves to receive emissions from the gyromagnetic material during examination sequences.

The various coils of scanner 12 are controlled by external circuitry to generate the desired fields and pulses, and to read emissions from the gyromagnetic material in a controlled manner. In the diagrammatical view of FIG. 1, a main power supply 38 is provided for powering the primary field coil 28. Driver circuitry 40 is provided for pulsing gradient field coils 30, 32 and 34, and typically includes amplification and control circuitry for supplying current to the coils as defined by digitized pulse sequences output by scanner control circuitry 14. Other control circuitry 42 is provided for regulating operation of RF coil 36. Circuitry 42 will typically include a switching device for alternating between active and passive modes of operation wherein the RF coil transmits and receives signals, respectively. Circuitry 42 also includes amplification circuitry for generating the RF pulses and for processing received emission signals.

Scanner control circuitry 14 includes an interface portion 44 which outputs signals for driving the gradient field coils and the RF coil, and for receiving data representative of the emissions produced in examination sequences. This interface component is coupled to control circuitry as represented generally at reference numeral 46. Control circuitry 46 commands execution of specific pulse sequences as defined by predetermined protocols selected via system control circuitry 16. Control circuitry 46 also serves to receive the emission signals and may perform subsequent processing on the received signals prior to transmission of the data to the system control circuitry. Scanner control circuitry 14 further includes one or more memory circuits 48 which store configuration parameters, pulse sequence descriptions, examination results, and so forth, during operation. Interface circuitry 50 is coupled to control circuitry 46 for exchanging data between scanner control circuitry 14 and system control circuitry 16. Such data will typically include selection of specific examination sequences to be performed, configuration parameters for these sequences, and acquired data which may be transmitted in raw or processed form from scanner control circuitry 14 for subsequent processing, storage, transmission and display.

System control circuitry 16 comprises an interface component 52 which receives data from scanner control circuitry 14 and transmits data and commands back to the scanner control circuitry. This interface component is coupled to control circuitry 54, which may include a CPU in a multi-purpose or application-specific computer or work station. Control circuitry 54 is coupled to memory circuitry 56 to store programming code for operation of the MRI system, as well as to store processed image data for later reconstruction, display and transmission. Additional interface circuitry may be provided for exchanging image data, configuration parameters, and so forth, with external system components such as the remote access and storage devices 18. Finally, system control circuitry 16 may include various peripheral devices for facilitating operator interface and for producing hard copies of reconstructed images. In the illustrated embodiment these peripherals include a monitor 58, a keyboard 60, a mouse 62, and a printer 64. Other peripherals, including photographic film processing equipment and so forth may, of course, be included as well.

Scanner 12 and the control circuitry associated therewith produce magnetic fields and radio frequency pulses in a controlled manner to excite specific gyromagnetic material within the subject patient and to sense emissions resulting from such materials. FIG. 2 illustrates an exemplary pulse sequence which may be carried out through system 10. The pulse sequence of FIG. 2 is a basic spin echo pulse sequence which may be represented as pulses produced on a series of logical axes, along with a signal axis. In the illustrated embodiment, the pulse sequence, designated generally by reference numeral 66, is presented as including a radio frequency axis 68, a signal axis 70, a slice select axis 72, a readout axis 74 and a phase encoding axis 76. It should be understood, however, that the techniques described herein are not limited to any particular type of pulse sequence, but may be applied to a wide variety of applications in MRI systems.

In the exemplary pulse sequence of FIG. 2, a first 90° RF pulse 78 is produced on the RF axis 68. At the same time, a positive-going gradient pulse 80 is produced on slice select axis 72. A signal results from the RF excitation pulse as indicated at reference numeral 82, the signal decaying over time. Positive-going slice select pulse 80 is followed by negative-going gradient pulse 84 on the same axis. Subsequent to the initial pulses of the sequence, gradient pulses are produced on the phase encoding and readout axes as indicated generally at reference numerals 86 and 88. A 180° RF pulse 90 is then generated along with a gradient pulse 92 on the slice select axis. The radio frequency excitation pulse produces an echo 96 on the signal axis 70 which is detected during application of a gradient pulse 94 on the readout axis. The acquired signals are subsequently processed, such as through two-dimensional Fourier transformation, to identify signal intensities emanating from specific phase-encoded and frequency-encoded locations in the selected slice. As will be appreciated by those skilled in the art, the logical pulses of the examination sequence may be produced on one or more physical axis of the MRI system to produce various images depending upon the anatomy to be imaged and the desired slice orientation.

FIG. 3 illustrates a portion of an exemplary pulse sequence as impacted by such factors as radio frequency amplifier delay and residual (i.e. uncompensated) eddy currents. The actual pulse sequence portion, indicated by reference numeral 98 in FIG. 3 may be illustrated in terms of an analog-to-digital converter window axis 100 which generally maps the turn-on time of the converter used to create the gradient pulses. In FIG. 3, the analog-to-digital converter window opens at a point in time indicated by reference numeral 102. Delays or shifts in the proper timing for the window, along with shifts in time for other associated circuitry, with respect to the gradient pulse can lead to imaging problems for the acquired signals, including ghosting, and so forth.

In the illustrated embodiment, the idealized gradient pulse is denoted at dash line 104. However, due to uncompensated eddy currents in the system generated by the onset and the termination of the gradient pulses, the actual gradient pulse profile may differ significantly from the idealized profile. In particular, as shown in FIG. 3, the onset of the gradient pulse may produce a first eddy current which results in a gradient portion 106 which opposes the idealized gradient profile. Similarly, at the termination of the gradient pulse, an additional eddy current may produce an oppositely oriented gradient portion 108 which further alters the gradient pulse profile and timing. The resulting gradient pulse, indicated at reference numeral 110 in FIG. 3 may be significantly deformed from its idealized shape, and delayed in time as a result of such uncompensated eddy currents. The ideal timing between an RF pulse 78, then, and the onset or point in time in which the gradient pulse reaches its desired amplitude, indicated by reference numeral 112 in FIG. 3, may be significantly delayed as indicated at reference numeral 114.

For the present purposes, delays such as those identified in FIG. 3 may be considered as group time delays resulting from one or more causes. In particular, time delays of the type illustrated in FIG. 3 tend to occur between radio frequency pulses and gradient pulses for one or more physical axis and one or more logical controlled axis, including the slice select axis, the readout axis, and the phase encoding axis. While heretofore known MRI systems may make some effort to preprogram offsets to compensate for one or more of these delays, such systems typically employ a single delay for all systems, failing to account for specific delays either between systems or between various axes of a single system. Moreover, such techniques do not account for changes in group time delays over the life of the MRI system, for variations in the delays as a function of slice orientation, and so forth.

In accordance with the present technique, compensation of group time delays resulting from one or more perturbing factors such as electronic circuitry and uncompensated eddy currents may be adjusted through a calibration procedure based upon image data acquired during a calibration sequence. In a preferred embodiment, spectral-spatial (SPSP) pulse sequences are produced during the calibration sequence to permit excitation of magnetization with both a specific location and a specific frequency offset. As will be appreciated by those skilled in the art, such SPSP pulse sequences are relatively immune to non-homogeneity in the $B_1$ or RF field of the system. While such pulse sequences are extremely useful in a variety of MRI examinations, they also present unique sensitivities to delays and inaccuracies in pulse timing of the type discussed above. For example, errors in relative timing between RF pulses and gradient waveforms for SPSP pulses can cause intensity variations of water signals in off-center slices. Such artifacts are employed in the present calibration technique to determine appropriate RF/gradient waveform time delays.

Figure 4:
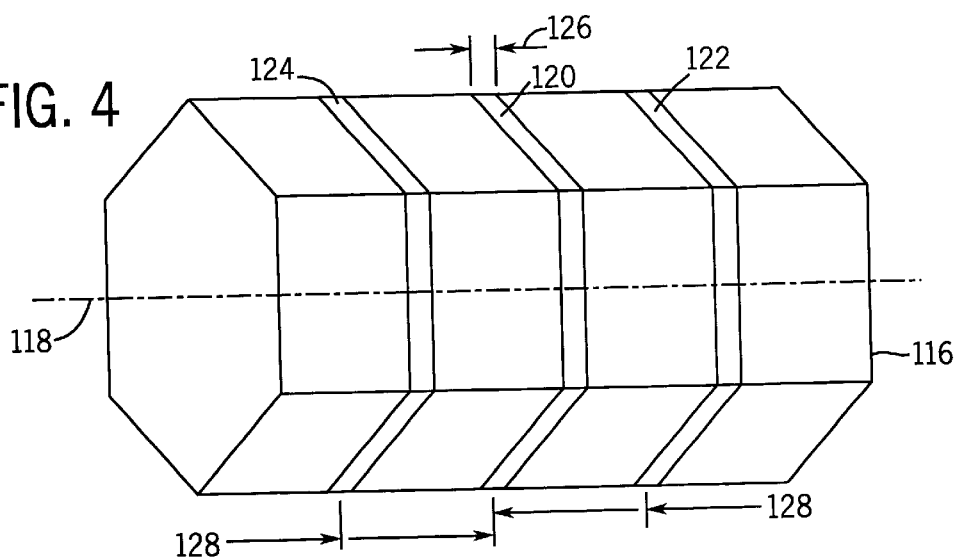
FIG. 4 is a physical view of an exemplary phantom used in generating calibration images for setting optimal time delays in accordance with aspects of the present invention.

In a presently favored embodiment, the calibration procedure employs a phantom for generating images both at the isocenter of the gradient field system and at least one location offset from the isocenter. FIG. 4 illustrates an exemplary phantom employed for this purpose. In the case of the phantom of FIG. 4, denoted generally by reference numeral 116, a hexagonal uniform water-filled phantom has a constant cross-sectional profile extending along a central axis 118. In the calibration sequence an image is generated at the isocenter of the gradient field system as indicated by slice 120 in FIG. 4. For improved sensitivity the thinnest possible slice is preferably prescribed. In addition to slice 120, slices 122 and 124 are produced at offsets from the isocenter. In the illustrated embodiment, slices 122 and 124 have a uniform thickness as indicated by reference numeral 126, identical to that of slice 120. Moreover, to facilitate the calibration sequence slices 122 and 124 are spaced from slice 120 by a uniform distance as indicated by reference numeral 128 in FIG. 4.

Figure 5:
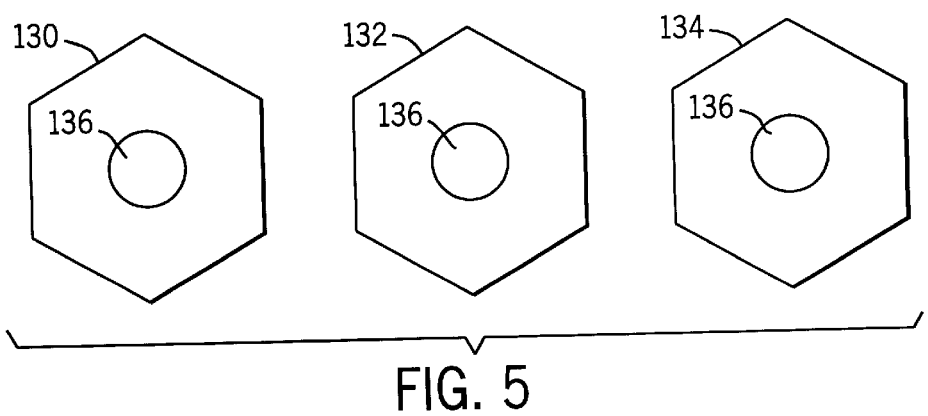
FIG. 5 is a diagram illustrating a series of test or calibration images generated based upon on the phantom of FIG. 4.

Image data of slices 120, 122 and 124 is preferably produced through application of an SPSP pulse sequence to produce images of the type illustrated in FIG. 5. The images, denoted 130, 132 and 134, represent image data of slices 124, 120 and 122 respectively. Within each image, a region of interest 136, such as within a central portion of the image matrix, is identified for comparison purposes during calibration. The images are analyzed, such as by control circuit 46 illustrated in FIG. 1, to obtain an average signal level within the region of interest for the center slice and for the two offset slices. The procedure is then repeated while systematically varying the delay between the RF and gradient waveforms, such as in two microsecond steps. The delay which provides the smallest difference between average intensities of the image for the isocenter slice, 120 in FIG. 4, and the off-center slices 122 and 124 in FIG. 4, is then selected as the optimum delay.

Figure 6:
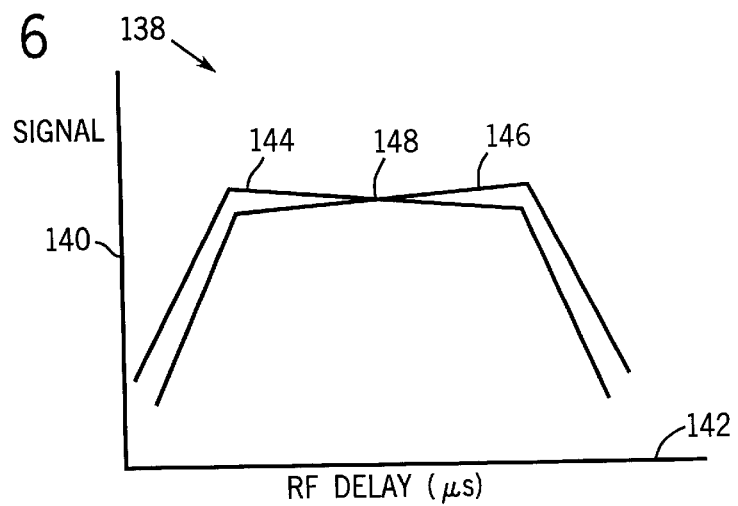
FIG. 6 is a graphical representation of signal intensities versus RF delays obtained through a calibration sequence.

FIG. 6 illustrates the resulting data based upon several calibration image sequences in a graphical format. The resulting data, indicated generally by reference numeral 138 in FIG. 6, may be presented graphically with the average signal level presented on a vertical axis 140 and the delay between the RF pulse and the gradient waveform along a horizontal axis 142. In general, the series of images present varying average signal strength data sets which take the form of characteristic functions 144 and 146 in FIG. 6. That is, as the RF time delay to the gradient waveform is varied, different deviations between the average signal level of the isocenter image and the offset images will be exhibited in the data. The minimal or optimal delay is selected by identifying the RF delay setting which produces the minimum difference between the averaged intensities within the region of interest, as indicated at reference numeral 148 in FIG. 6.

Figure 7:
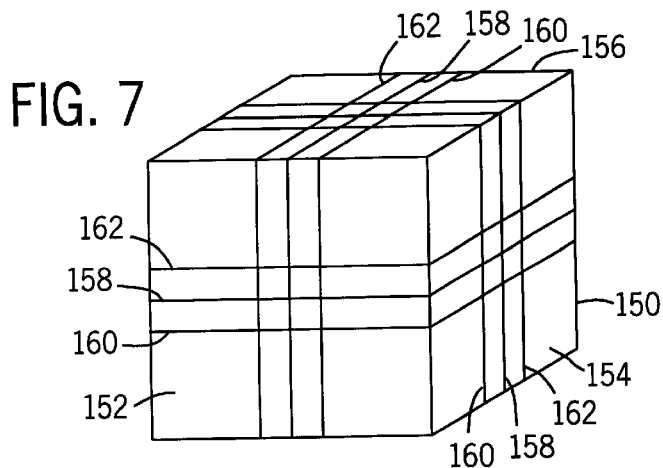
FIG. 7 is a physical diagram of an alternative phantom for use in calibrating multiple axes of an MRI system.

As will be appreciated by those skilled in the art, various alternative configurations may be envisaged for the phantom employed in the calibration sequence. In an alternative embodiment, a phantom may be used to calibrate multiple physical axes of the MRI scanner in a single placement of the phantom within the device. FIG. 7 illustrates an exemplary phantom of this type. As shown in FIG. 7, a three-dimensionally uniform phantom may be employed, such as a rectangular block or cube 150 which presents faces 152, 154 and 156 which may be generally aligned with the physical axes of the scanner. Once the phantom is appropriately positioned in the scanner, the series of images discussed above at the isocenter and offset from the isocenter may be produced as indicated at reference numerals 158, 160 and 162 in FIG. 7.

Figure 8:
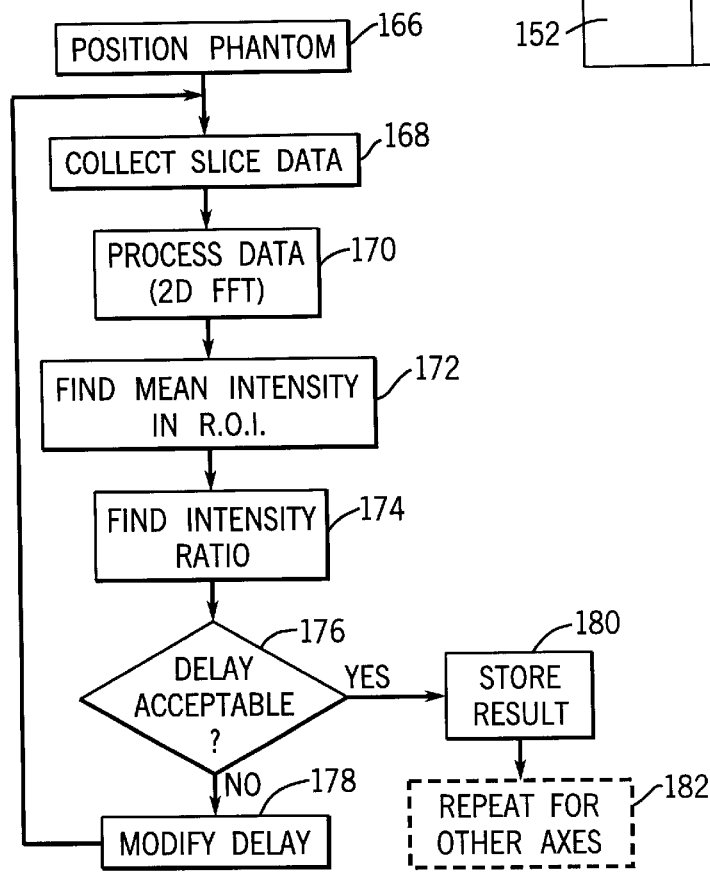
FIG. 8 is a block diagram of exemplary control logic for carrying out a calibration sequence used to identify optimal RF and gradient time delays; and, FIG. 9 is a graphical representation of an SPSP pulse sequence for use in the calibration logic of FIG. 8.

FIG. 8 summarizes in a block diagram the steps in the calibration sequence discussed above. The logical steps of the sequence, indicated generally at reference numeral 164 begin with step 166 where the phantom is positioned in the scanner. At step 168 the slice data is collected, including the data for at least two offset images, preferably at the isocenter of the gradient field system, and at two locations offset from the isocenter. In a presently preferred embodiment, the slice thicknesses may be of the order of 3 mm and the offset between the slices on the order of 5 cm. Other slice thicknesses and offsets may, of course, be employed.

At step 170, the image data for the three images is processed, such as through a two-dimensional fast Fourier transformation to obtain intensity data for the discrete picture elements or pixels of the image matrix. At step 172 the mean intensity of the region of interest is determined for each image. In a preferred embodiment, the region of interest may occupy approximately 75% of the phantom image in a central region thereof. At step 174 a comparison is performed between the resulting mean intensities of the isocenter and offset images, such as through generation of an intensity ratio value. Again, to appropriately optimize the RF/gradient waveform time offset, the ratio value would be as close to 1.0 as possible.

At step 176 the system reviews the data collected through the calibration sequence to determine whether the optimal delay has been identified. Initially, the result of the query at step 176 will be negative, resulting in modification of the delay at step 176 and return through the calibration steps summarized above. Again, the delay may be modified in various time steps such as in steps of 2 microseconds per iteration. Once the optimal time delay is identified at step 176, the results of the calibration sequence are stored at step 180. In general, identification of the optimal delay will be indicated by the tendency of the mean intensity ratio to vary more greatly through the subsequent iteration steps from values already identified closer to unity. Finally, at step 182 the calibration sequence may be performed for other physical axis of the scanner.

Figure 9:
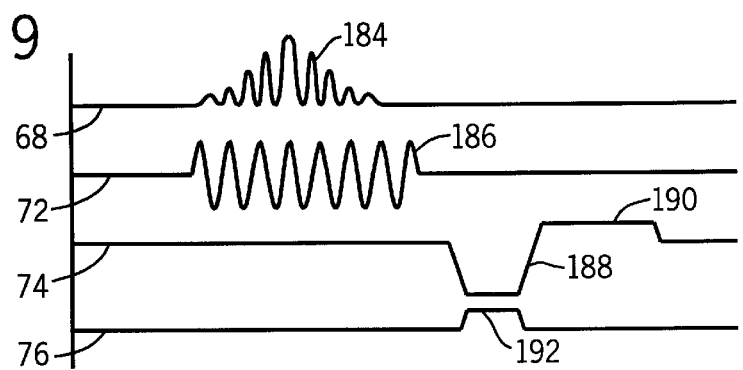

FIG. 9 represents an exemplary SPSP pulse sequence employed through the calibration sequence summarized in FIG. 8. As will be appreciated by those skilled in the art, the SPSP pulse sequence may be summarized by pulses applied on the radio frequency axis 68, the slice select axis 72, the readout axis 74, and the phase encoding axis 76. The pulse sequence includes a series of RF pulses 184 which are created during an oscillating slice select gradient sequence 186. The RF pulse sequence 184 is followed by a series of gradients 188 and 190 on the phase encoding axis 76.

What is claimed is:

1. A method for calibrating a pulse sequence in a magnetic resonance imaging system, the pulse sequence including at least one radio frequency pulse and a plurality of gradient pulses, the method comprising the steps of:
   generating calibration images of a test object;
   comparing intensity values for a region of interest of the calibration images; and
   calibrating the pulse sequence to minimize deviations of the intensity values, wherein calibrating includes adjusting a time delay between a radio frequency pulse and at least one gradient pulse.

2. The method of claim 1, wherein a first calibration image is generated at an isocenter of a gradient system and at least one second calibration image is generated at a known distance from the first calibration image.

3. The method of claim 2, wherein two second calibration images are generated at equal distances from the first calibration image and on either side thereof.

4. The method of claim 1, wherein the steps of generating the calibration images and comparing the intensity values are iteratively performed to identify a minimum deviation of the intensity values.

5. The method of claim 1, wherein the calibration images are generated by a spectral-spatial pulse sequence.

6. The method of claim 1, wherein the steps are repeated for at least two physical axes of a magnetic resonance scanner.

7. A method for calibrating a time delay between a radio frequency pulse and at least one gradient pulse in a magnetic resonance imaging system, the method comprising the steps of:
   (a) generating a plurality of parallel calibration images of a phantom;
   (b) averaging an image parameter of each calibration image within a region of interest;
   (c) comparing the average image parameters;
   (d) adjusting a time delay between a radio frequency pulse and at least one gradient pulse in an imaging pulse sequence; and
   (e) repeating steps (a), (b), (c) and (d) to identify a time delay resulting in a desired deviation between the average image parameters.

8. The method of claim 7, wherein the image parameter is representative of intensity of magnetic resonance signals.

9. The method of claim 7, wherein a first calibration image is generated a known location in a gradient field system and at least one second calibration image is generated at a known offset from the first calibration image.

10. The method of claim 9, wherein the first calibration image is generated at an isocenter of the gradient field system.

11. The method of claim 9, wherein at least two second calibration images are generated at equal distances from the first calibration image.

12. The method of claim 7, wherein steps (a) through (e) are performed for at least two physical axes of a magnetic resonance scanner.

13. The method of claim 7, wherein the calibration images are generated via a spectral-spatial pulse sequence.

14. A method for calibrating a magnetic resonance imaging system, the system including a radio frequency coil and a plurality of gradient field coils, the method comprising the steps of:

executing a spectral-spatial pulse sequence to generate calibration images of a calibration phantom;

comparing the calibration images;

adjusting a time delay between a radio frequency pulse generated via the radio frequency coil and a gradient pulse generated via at least one of the gradient field coils based upon the comparison.

15. The method of claim 14, wherein the step of comparing the calibration images includes averaging a parameter of the calibration images within a region of interest and comparing the resulting average parameter values.

16. The method of claim 14, wherein the steps are performed iteratively to determine a time delay resulting in a minimal deviation between parameters of the calibration images.

17. The method of claim 14, wherein the steps are performed for at least two physical axes of a magnetic resonance scanner.

18. The method of claim 14, wherein the calibration images include a first image generated at an isocenter of a gradient field system produced by the gradient coils, and at least one second image generated at a known offset from the isocenter.

19. The method of claim 14, wherein the calibration images include three images generated at known distances from one another.

20. A magnetic resonance imaging system comprising:

a scanner having a radio frequency coil and a plurality of gradient field coils;

a control circuit configured to execute a calibration sequence to determine a desired time delay between a radio frequency pulse and a gradient field pulse, the calibration sequence including generation of a plurality of calibration images, comparison of the calibration images, and adjustment of the time delay to minimize deviations between a parameter of the calibration images; and a memory circuit for storing a value representative of the desired time delay.

21. The system of claim 20, further comprising a calibration phantom, the calibration images being generated of the calibration phantom.

22. The system of claim 21, wherein the calibration phantom has a uniform cross section about a longitudinal axis thereof.

23. The system of claim 22, wherein the calibration phantom has a uniform cross section about three orthogonal axes thereof.

24. The system of claim 20, wherein the control circuit is configured to generate the calibration images via a spectral-spatial pulse sequence executed on the radio frequency and gradient field coils.

25. A system for calibrating a magnetic resonance imaging device, the system comprising:

means for generating a plurality of calibration images at known offsets from one another;

means for comparing parameters of the calibration images;

means for adjusting a time delay between a radio frequency pulse and at least one gradient pulse based upon comparison of the calibration images.

26. The system of claim 25, wherein the means for generating the calibration images includes a phantom of uniform cross section along an axis to be calibrated.

27. The system of claim 25, wherein the means for comparing parameters compares average intensity values of the calibration images within a region of interest.

28. The system of claim 25, wherein the means for generating the calibration images executes a spectral-spatial pulse sequence to generate the calibration images.

29. The system of claim 25, wherein the means for generating the calibration images is configured to generate calibration images for at least two orthogonal axes of a magnetic resonance scanner.

* * * * *